United States Patent [19]

Boutaud et al.

[11] Patent Number: 5,072,219
[45] Date of Patent: Dec. 10, 1991

[54] DIGITAL-ANALOG CONVERSION SYSTEM INCLUDING A DIGITAL MODULATOR HAVING SEVERAL QUANTIFICATION LEVELS, ASSOCIATED WITH A DIGITAL-ANALOG CONVERTER

[75] Inventors: Frederic Boutaud, Houston, Tex.; Pierre Carbou, Venice; Paul Correia, Antibes, both of France

[73] Assignee: Texas Instruments Incorporated, Dallas, Tex.

[21] Appl. No.: 476,088

[22] Filed: Feb. 7, 1990

[30] Foreign Application Priority Data

Dec. 27, 1989 [FR] France ............................ 89 01556

[51] Int. Cl.$^5$ ............................................. H03M 1/66
[52] U.S. Cl. ..................................... 341/150; 341/143
[58] Field of Search ................... 341/143, 150; 375/27, 375/28, 33, 34

[56] References Cited

U.S. PATENT DOCUMENTS

| | | |
|---|---|---|
| 4,001,813 | 1/1977 | Kosakowski ........................ 341/172 |
| 4,573,038 | 2/1986 | Carbrey ............... ......... 341/172 X |
| 4,622,536 | 11/1986 | Shih et al. .............. ....... 341/172 X |
| 4,633,223 | 12/1986 | Senderowicz .............. ...... 341/172 |
| 4,661,802 | 4/1987 | Yukawa ............................ 341/150 |
| 4,764,753 | 8/1988 | Yukawa .......................... 341/172 X |
| 4,896,156 | 1/1990 | Garverick ........................ 341/143 |

FOREIGN PATENT DOCUMENTS 62-137922  6/1987  Japan .................................. 341/172

Primary Examiner—Benjamin R. Fuller
Assistant Examiner—Randy W. Gibson
Attorney, Agent, or Firm—William E. Hiller; N. Rhys Merrett; Melvin Sharp

[57] ABSTRACT

This digital-analog conversion system comprises a digital modulator (1) having several quantification levels formed by a second order Delta-Sigma modulator and a digital-analog converter and switched capacitors filter set (3) whose law of progression between the different analog levels is independent of the absolute and relative values of the constituent components of the said assembly.

8 Claims, 4 Drawing Sheets

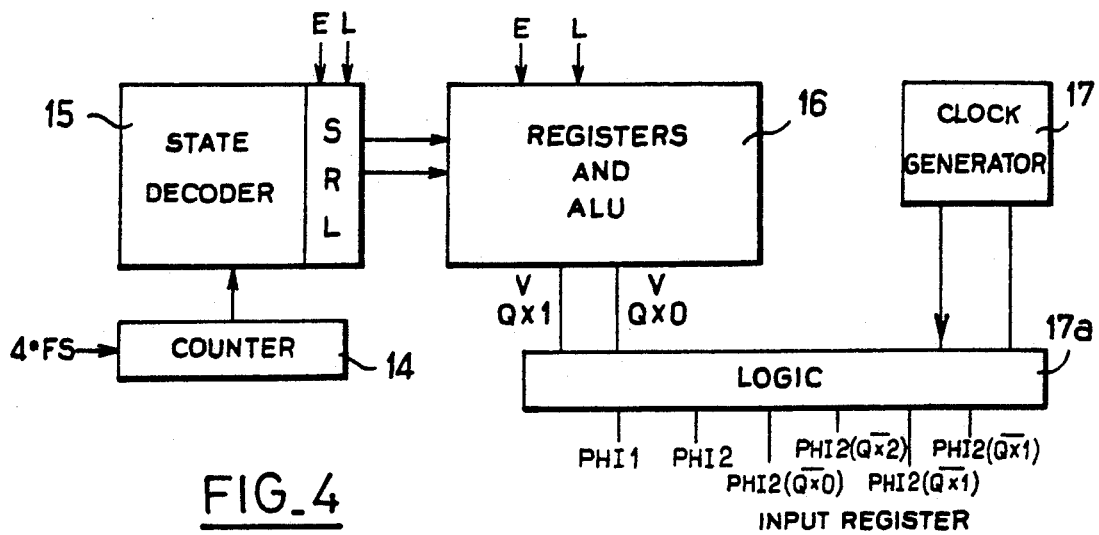
FIG_4
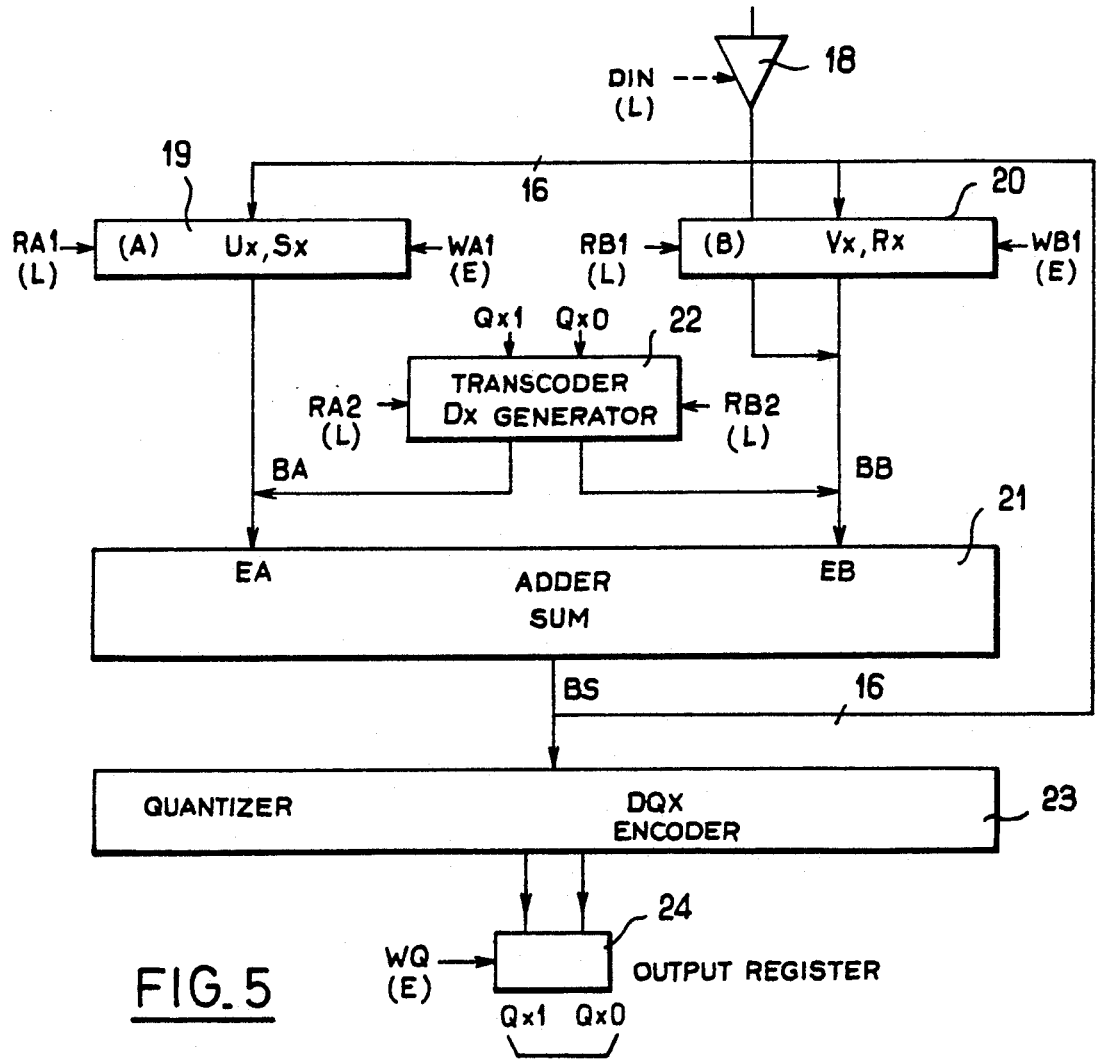
FIG_5

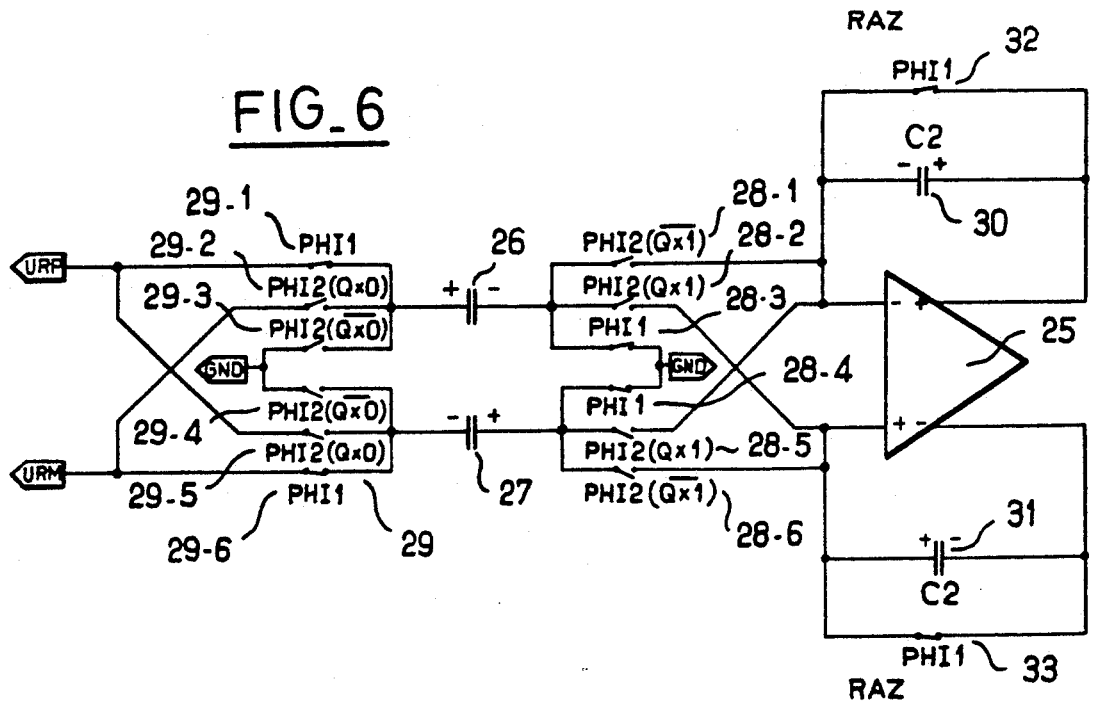
FIG_6
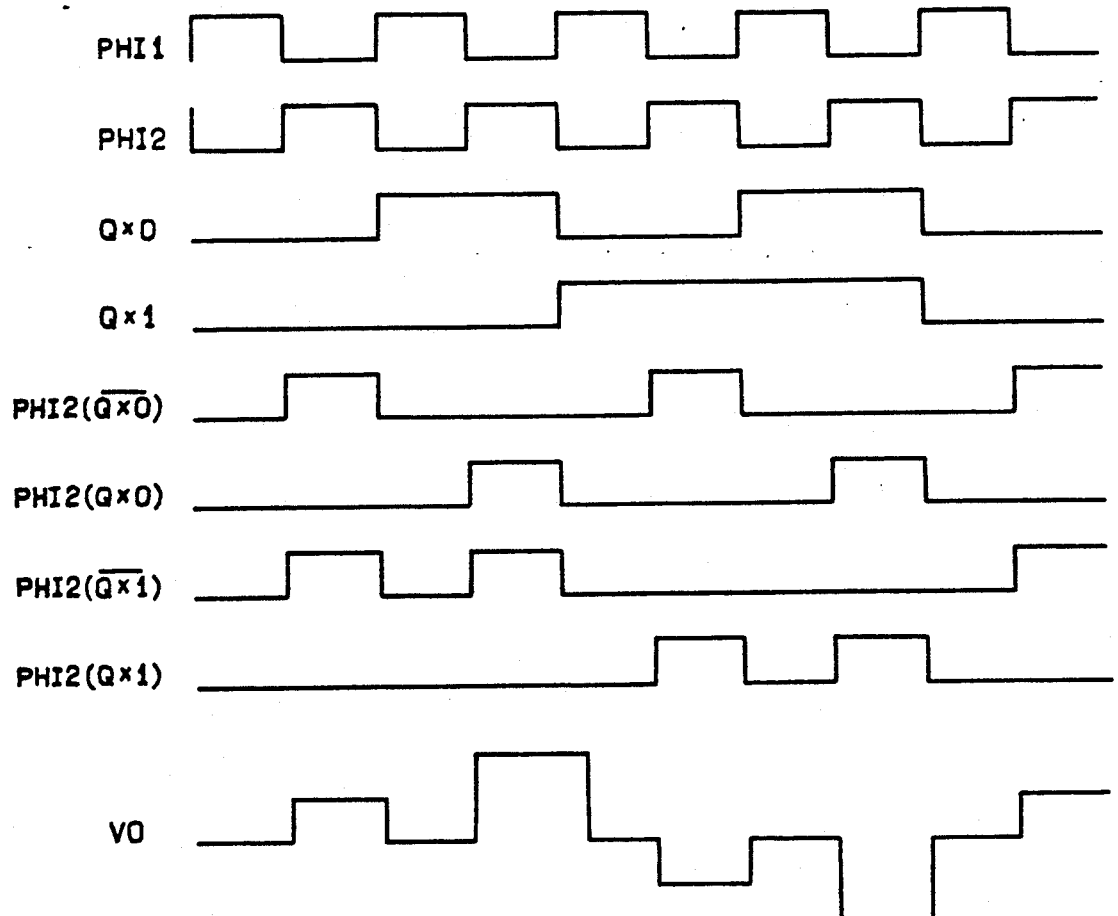
FIG_7

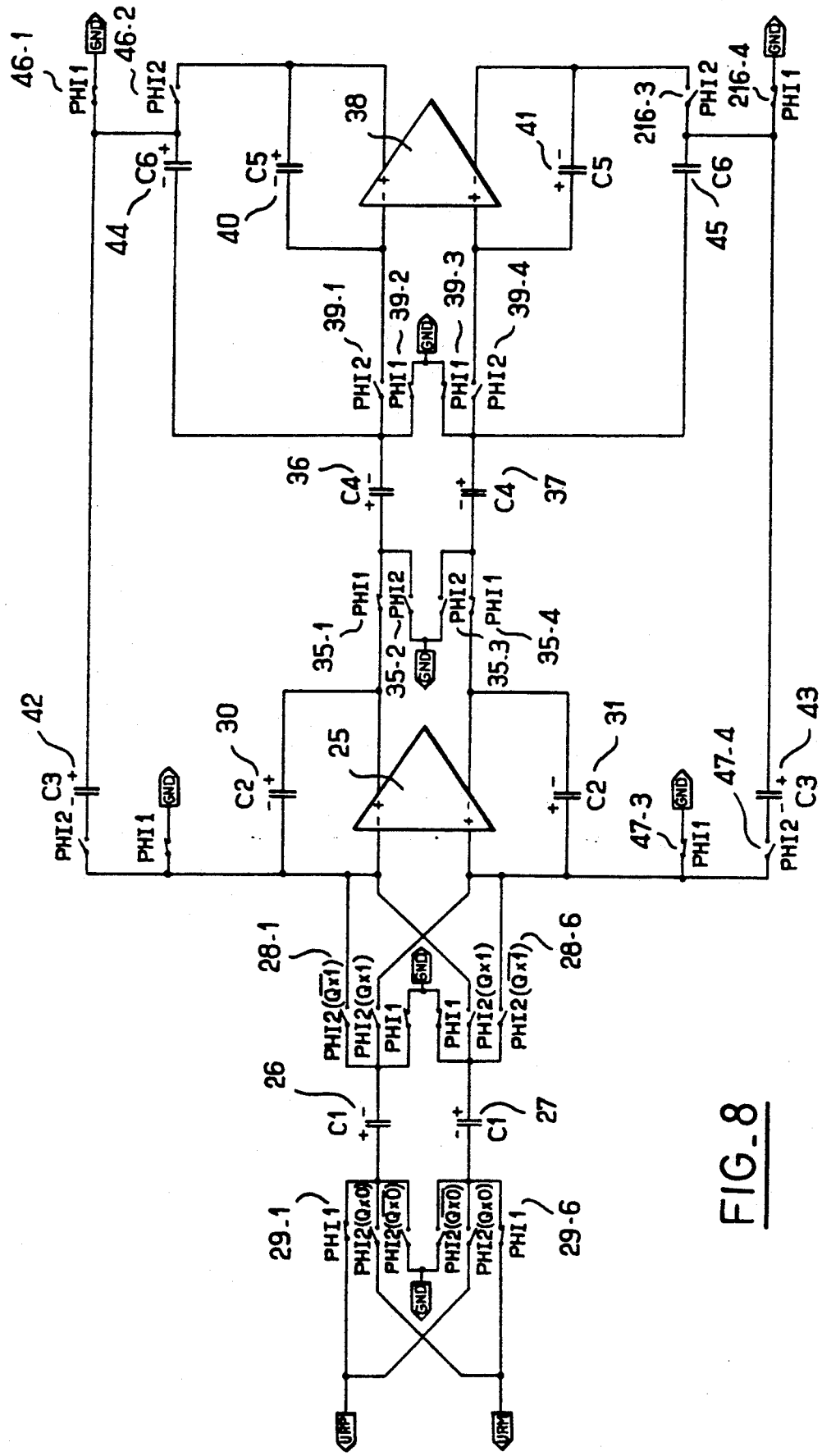
FIG._8

DIGITAL-ANALOG CONVERSION SYSTEM INCLUDING A DIGITAL MODULATOR HAVING SEVERAL QUANTIFICATION LEVELS, ASSOCIATED WITH A DIGITAL-ANALOG CONVERTER

The present invention relates to digital-analog conversion systems.

In the known devices of this type, the conversion is carried out in three phases.

the number of bits of digital samples is reduced to one by oversampling and modulation (Delta-Sigma Modulation).

the one-bit samples are converted into an analog signal by means of a simple one-bit digital-analog converter.

a filtering or smoothing of the analog signal is performed.

A disadvantage of this system is the out-of-band noise included in the spectrum of the analog signal.

Furthermore, the smoothing filter must satisfy severe conditions of precise cut-off frequency and high rejection in the cut-off band.

An object of the invention is to produce a digital-analog conversion system of the abovementioned type having improved out-of-band performance.

Another object of the invention is to produce a conversion system which can be integrated in the form of a CMOS digital circuit, whose minimum resolution is 12 bits and which is adapted to the specifications for telephonic applications.

An object of the invention is therefore a digital-analog converter, characterized in that it comprises an operational amplifier to the inputs of which are connected first capacitors by means of a first group of switches, the said first capacitors being connected moreover either to reference voltage sources, or to ground by means of a second group of switches, the inputs of the operational amplifier being furthermore connected to the corresponding outputs of the latter via second capacitors, the first and second groups of switches being controlled by digital signals to be converted in order to ensure during a first section of a conversion phase, the pre-charging of the first capacitors from reference voltage sources and during a second section of a conversion phase or redistribution phase, the connection of the first capacitors to the system formed by the amplifier and the second capacitors in order to obtain at the output of the amplifier, several analog voltage levels corresponding to the digital signals to be converted, the conversion being defined by the expression Vs (nT)=(C2/C1) VR (1−2QX1 (nT)) (1+QxO(nT)) in which Vs is the analog output voltage, Vs (nT) represents the value of the voltage Vs at the instant nT, T is the sampling period and n is an integer without dimensions.

Another object of the invention is a digital-analog converter and switched capacitors filter assembly, characterized in that it comprises a first stage formed by a digital-analog converter such as defined above and a second switched capacitors filtering stage comprising an amplifier including integration capacitors and whose inputs are connected to the outputs of the operational amplifier of the first stage via capacitors and a third and a fourth group of switches and whose outputs are looped back to the inputs of the operational amplifier of the first stage via feedback capacitors, switches being interposed in the circuits connecting the feedback capacitors with the outputs of the amplifier of the second stage and the inputs of the operational amplifier of the first stage, the said switches being controlled by clock signals used in combination with the digital signals to be converted for generating control signals for the first digital-analog converter.

Another object of the invention is a digital-analog conversion system, characterized in that it comprises a digital modulator having several quantification levels and associated with a digital-analog converter and filter assembly such as defined above.

The invention will be better understood with the help of the following description, given solely by way of example and with reference to the appended drawings in which:

FIG. 4A is a block diagram of a processing unit with the help of which the digital modulator of FIG. 3 is produced;

FIG. 4B is a diagram showing the clock phase signals and the cycle stages for the processing unit of FIG. 4A;

FIG. 5 is a block diagram of the architecture of the computing unit used in the conversion system according to the invention;

FIG. 6 is a general block diagram of the digital-analog converter used in the construction of the conversion system according to the invention;

FIG. 7 is a diagram showing the control signals of the circuit in FIG. 6; and

FIG. 8 is a general block diagram of a second order, switched capacitors filter incorporating the digital-analog converter of FIG. 6.

FIG. 1 shows a digital-analog converter comprising a digital modulator 1 receiving on its input a digital signal Fi of n bits and delivering at its output a signal Fs of p bits.

The modulator 1 is connected at its output to a unit 2 comprising a digital-analog converter associated with a low pass filter and which supplies an analog output signal.

Figure 1:
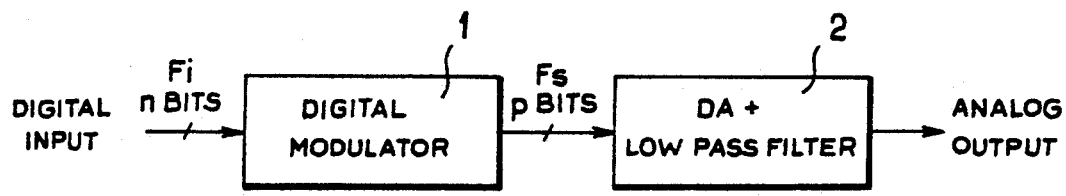
FIG. 1 is a general block diagram of a digital-analog converter.
Figure 2:
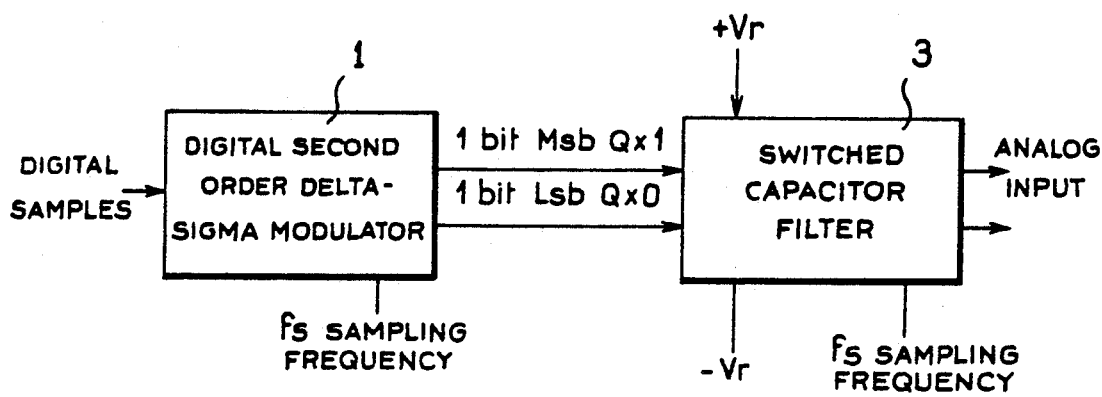
FIG. 2 is a general block diagram of a digital-analog conversion system according to the invention.

The conversion system shown in FIG. 2 includes a digital modulator 1 which is constituted by a second order Delta-Sigma modulator and which receives digital samples on its input and which is controlled by a sampling frequency Fs.

It is connected to a switched capacitors filter 3 also controlled by the sampling frequency Fs and which delivers at its output an analog output signal By way of example, the output of the modulator 1 is an output supplying two bits QX1 and QXO.

The principal characteristics of such a circuit are:

Digital modulator output: two bits quantifying four levels +2VR, +VR.−VR −2VR.

The smoothing filter 3 is designed in the form of a totally differential structure.

The voltage reference is totally differential and supplies two pulsed voltages + VR, − VR at a frequency equal to twice the sampling frequency of the modulator 1 and of the filter 3.

The two-bit digital-analog conversion can be carried out in the first stage of the smoothing filter 3.

Figure 3:
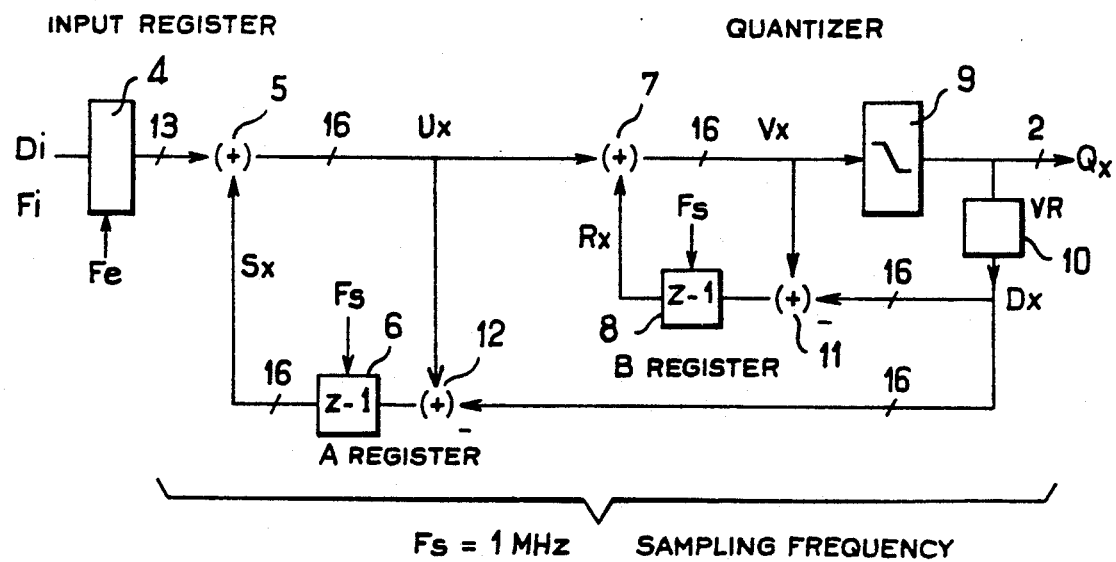
FIG. 3 is a functional block diagram of a Delta-Sigma digital modulator used in the construction of the conversion system of FIG. 2.

The digital modulator used in the construction of the conversion system of FIG. 2 is shown in greater detail in FIG. 3.

The digital modulator 1 constitutes the logic section of the conversion system.

Its function is to reduce the number of bits of the digital input samples in order to facilitate the analog conversion. This reduction in the number of bits is obtained by means of a substantial increase in the sampling frequency and a modulation of the samples The modulator shown by way of example in FIG. 3 is a second order Delta-Sigma modulator.

It comprises an input register 4 which receives on its input a signal Di of frequency Fi and is controlled by an input sampling frequency Fe.

The output of the register 4 is connected to a first adder 5 which is furthermore connected to the output of a first register 6 controlled at the output sampling frequency Fs.

The output of the adder 5 is connected to a second adder 7 which is also connected to the output of a second register 8.

The output of the second adder 7 is connected to the input of a quantifier 9 whose output constitutes the output of the modulator.

The output of the quantifier 9 is connected via an inverting circuit 10 to an input of a third adder 11 of which another input is connected to the output of the second adder 7 and whose output is connected to the second register 8, and to an input of a fourth adder 12 of which another input is connected to the output of the first adder 5 and whose output is connected to the input of the first register 6

The input samples Di encode, in 13 bits, a low frequency signal, in the order of a few KHz.

They are loaded into the input register 4 at the frequency Fe and are read out at the operating frequency Fs of the modulator.

The digital values are encoded by the twos complement method.

The quantifier 9 supplies at its output two bits QX1, QXO, encoding four levels adapted to the analog-digital conversion circuitry used subsequently.

The quantifier 9 is produced in the form of a correspondence table.

The definition of the quantifier used in the described application is given below by means of its truth table

TABLE 1

Definition of the quantifier for second order delta-sigma digital modulator

| Vx | | | | Qx1 | Qx0 | analog |
|---|---|---|---|---|---|---|
| 01xx | xxxx | xxxx | xxxx | 0 | 1 | +2 |
| 001x | xxxx | xxxx | xxxx | 0 | 1 | +2 |
| 0001 | xxxx | xxxx | xxxx | 0 | 1 | +2 |
| 0000 | 1xxx | xxxx | xxxx | 0 | 1 | +2 (2VR) |
| 0000 | 0xxx | xxxx | xxxx | 0 | 0 | +1 (VR) |
| 1111 | 1xxx | xxxx | xxxx | 1 | 0 | −1 (−VR) |
| 1111 | 0xxx | xxxx | xxxx | 1 | 0 | −2 (−2VR) |
| 1110 | xxxx | xxxx | xxxx | 1 | 1 | −2 |
| 110x | xxxx | xxxx | xxxx | 1 | 1 | −2 |
| 10xx | xxxx | xxxx | xxxx | 1 | 1 | −2 |

The decision thresholds on the value of Vx for generating the four states of the output bits QX1, QXO = g(Vx) can be changed as a function of performance objectives such as the signal/noise ratio of the modulator.

The digital reference value is associated with the analog reference voltage used in the analog conversion.

In the present example, the digital reference value is equal to $2^{12}=4096$, which gives feedback values DX shown in the following Table 2.

TABLE 2

| Qx1 | Qx0 | | | 0x | | | −0x | | |
|---|---|---|---|---|---|---|---|---|---|
| 0 | 1 | 0001 | 0000 | 0000 | 0000 | 1111 | 0000 | 0000 | 0000 |
| 0 | 0 → | 0000 | 1000 | 0000 | 0000 | 1111 | 1000 | 0000 | 0000 |
| 1 | 0 | 1111 | 1000 | 0000 | 0000 | 0000 | 1000 | 0000 | 0000 |
| 1 | 1 | 1111 | 0000 | 0000 | 0000 | 0001 | 0000 | 0000 | 0000 |

In order to avoid performing subtractions it is the value −DX which is generated and added to the values UX and VX of the output signals of the input register 4 and of the adder 7.

The digital modulator is embodied in a processing unit shown in FIG. 4A.

It comprises a two-bit cycle counter 14 connected to a state decoder 15 and to a computing unit 16 and a clock signals generator 17 generating signals PHI1, PHI2. The outputs of the computing unit 16 and of the clock signals generator 17 are connected to a logic assembly 17a which supplies at its output the signals PHI1, PHI2 and the signals PHI2 $(\overline{QXO})$, PHI2 (QXO), PHI2 (QX1), PHI2 $(\overline{QX1})$ resulting from the combination of the signals PHI2, QXO, QX1, $\overline{QXO}$, and $\overline{QX1}$. and intended to provide the control of the digital-analog converter which will be described with reference to FIG. 6 and of the switched capacitors filter 3 (FIG. 2) of which it is a part.

The counter 14 is controlled by a sequencing clock signal 4*FS.

During a sampling period, the four available cycles are used for carrying out the four operations of the modulation function illustrated by the following Table 3.

TABLE 3

| 0 | D1 | Ux = Sx + Di |
| 1 | D2 | Vx = Rx + Ux |
| 2 | D3 | Rx = Vx − Dx |
| 3 | D4 | Sx = Ux − Dx |

The computing unit will now be described in greater detail with reference to FIG. 5.

It comprises an input register 18 corresponding to the register 4 in the circuit of FIG. 3, connected on the one hand to a first register 19 and on the other hand to a second register 20 respectively materializing the registers 6 and 8 of FIG. 3.

The input register 18 is controlled by signals DIN while the registers 19 and 20 are respectively controlled by the signals RA1, WA1, and RB1, WB1 which control reading and writing.

The first register 19, or register A, is connected at its output to an input EA of an adder 21 materializing the functions of the adders 5, 7, 11 and 12 of the circuit shown in FIG. 3.

The second register 20, or register B, is connected to an input EB of the adder 21.

The inputs EA and EB of the adder 21 are also connected to corresponding outputs of a −DX generator transcoder 22 controlled by the signals RA2 and RB2 in the readout mode and receiving the signals QX1 and QXO coming from the output of the computing unit.

The output of the adder is looped back to the inputs of the registers A and B, 19 and 20, and it is also connected to the input of a quantifier-encoder 23 which materializes the quantifier 9 shown in the circuit of FIG. 3.

The outputs of the quantifier 23 are connected to the corresponding inputs of an output register 24 controlled by a signal WQ in the write mode and which supplies at its output the signals QX1 and QXO.

The processing unit of FIG. 4A is controlled by two clock phases as shown in the diagram of FIG. 4B, and including:

(1) a readout phase L during which the control signals are set and the data are read out and placed at the inputs of the adder 21; and (2) write phase E during which the result of the computation is loaded into the selected register in the write mode.

As shown in FIG. 4B, the system comprises three pipeline levels; one for the counter 14, one for the state decoder 15 and one for the execution of the cycle in the computing unit 16 (FIG. 4A).

The functioning of the computing unit is controlled by eight signals:

five readout signals RA1, RA2, RB1, RB2, DIN which are active during the readout phase L and placing, on the bus BS, a datum maintained until the next readout phase L.

three write signals WA1, WA2, WQ enabling the loading, during the write phase E, of the value present on the bus BS.

These eight signals are generated by the state decoder 15 (FIG. 4A) from signals which it receives from the cycle counter 14.

The truth table of the quantifier 23 is shown in Table 1 given above.

The bit QX1 is equal to the most significant bit VX15 (the sign bit).

The bit QXO is obtained by a logic combination of the five most significant bits VX15, VX14, VX13, VX12 and VX11.

$$QXO = AND\,(OR\,(VX15, VX14, VX13, VX12, VX11),\\ NAND\,(VX15, VX14, VX13, VX12, VX11)).$$

The transcoder 22 generates, by hard wiring, from the signals QX1 and QXO, the feedback value—DX according to Table 2.

The four operations of the modulator given by the Table 3 are performed by the following four cycles:

A+Di→A                                    CYCLE 1

Readout of the content of the register A under the action of the signal RA1 validated during the phase L, Readout of the content of the input register 18 under the action of the signal DIN validated during the phase L, Result of the addition placed on the bus BS and written into the register A under the action of the signal WA1 active during the phase E.

B+A→B                                    CYCLE 2

Readout of the content of the register A under the action of the signal RA1 validated during the phase L, Readout of the content of the register B under the action of the signal RB1 validated during the phase L, Result of the addition placed on the bus BS and written into the register B under the action of the signal WB1 active during the phase E, Result of the quantification stored in the output register 24 under the action of the signal WQ active during the phase E.

B−DX→B                                   CYCLE 3

Readout of the content of the register B under the action of the signal RB1 validated during the phase L, Readout of the signal—DX supplied by the transcoder 22 under the action of the signal RA2 validated during the phase L, Result of the addition placed on the bus BS and written into the register B under the action of the signal WB1 active during the phase E.

A−DX→A                                   CYCLE 4

Readout of the content of the register A under the action of the signal RA1 validated during the phase L, Readout of −DX under the action of the signal RB2 validated during the phase L, Result of the addition placed on the bus BS and written into the register A under the action of the signal WA1 active during the phase E.

The control signals are generated by the state decoder 15 from the cycle number according to the following Table 4:

|         | RA1 | RA2 | RB1 | RB2 | DIN | WA1 | WB1 | WQ |
|---------|-----|-----|-----|-----|-----|-----|-----|----|
| CYCLE 1 | 1   | 0   | 0   | 0   | 1   | 1   | 0   | 0  |
| CYCLE 2 | 1   | 0   | 1   | 0   | 0   | 0   | 1   | 1  |
| CYCLE 3 | 0   | 1   | 1   | 0   | 0   | 0   | 1   | 0  |
| CYCLE 4 | 1   | 0   | 0   | 1   | 0   | 1   | 0   | 0  |

The digital-analog converter which is part of the switched capacitors filter 3 of the circuit shown in FIG. 2 will now be described with reference to FIG. 6.

It comprises an operational amplifier 25 to the inputs of which are connected capacitors 26, 27 of capacity C1 by means of a first group of switches 28-1 to 28-6, the capacitors 26, 27 furthermore being connected by their terminals at the opposite end from that of the first group of switches to two reference voltage sources VRP, VRM, by means of a second group of switches 29-1 to 29-6.

The negative input of the amplifier 25 is connected to its corresponding output by a capacitor 30 of capacity C2.

The positive input of the amplifier 25 is connected to its corresponding output by a capacitor 31 of capacity C2.

Switches 32, 33 for zero resetting the capacitors 30 and 31 are respectively connected to the terminals of these capacitors.

The principle of the digital-analog conversion is based on the following conversion table:

| Digital modulator 1 Output code | | Analog output level |
| --- | --- | --- |
| QX1 | QX0 | |
| 0 | 1 | +2Vr |
| 0 | 0 | +Vr |
| 1 | 0 | −Vr |
| 1 | 1 | −2Vr |

By the use of a differential system in which the signals +Vr and −Vr are available, the generation of the four analog levels of the converter can be carried out using a switched capacitors technique in a way which is independent from the ratio of capacities (which, because of their inaccuracies, introduce non-linearities into the conventional converters based on the ratios of capacitances).

The digital-analog conversion using the circuit of FIG. 6 is carried out as follows.

The first section of a conversion phase (the precharging phase) is the same whatever the level to be generated may be. The capacitors 26, 27 of capacitance C1 are charged, one with the value +Vr, the other with the value −Vr while the capacitors 30, 31 of capacitance C2 are discharged.

The second section of a conversion phase (redistribution phase) is carried out by connecting the capacitors 26, 27 to the system constituted by the amplifier 25 and the capacitors 30, 31. The charges of the capacitors 26, 27 are then transferred into the capacitors, 30, 31.

The method of making this connection is dependent on the code generated by the digital modulator and corresponds to the generation, at the output of the amplifier 25, of one of four analog output levels.

The conversion law is defined by the following equation: $1-2QX1))(1+QX0(nT))$ $$Vs(nT)=(C2/C1)Vr$$

in which Vs is the analog output signal, Vs (nT) represents the value of the voltage Vs at the instant nT, T is the sampling period and n is an integer without dimensions.

The components used being the same whatever the analog level generated may be, the law of progression between these different levels is independent of the absolute values but also of the relative values of the components. The ratio of the capacities C1 and C2 has no effect on the gain of the system.

As shown in FIG. 7, the output signal thus generated is constituted from a series of pulses of calibrated levels (4 levels) containing the data of the signal encoded by the digital modulator and the high frequency quantification noise generated by the modulator. A low-pass filtering of this signal is necessary in order to separate the useful signal from the high frequency quantification noise.

Thus the digital signal 00 gives rise to the production, at the output terminals of the amplifier 25, of a voltage Vr on the one hand by connecting to ground, by the closing of the switches 29-3 and 29-4, the terminals of the capacitors 26, 27, which were connected, during the pre-charging phase, to the voltages VRP and VRM, and on the other hand by connecting, by the closing of the switches 28-1 and 28-6, each of the other terminals of the capacitors 26 and 27 respectively to the negative input and to the positive input of the amplifier 25.

A voltage Vr corresponding to the digital signal 00 appears at the outputs of the amplifier.

Similarly, there is obtained by an appropriate operation of the switches 28-1 to 28-6 and 29-1 to 29-6, analog voltages having the three other levels −Vr, +2Vr, −2Vr respectively corresponding to the digital signals 10, 01, and 11.

The method of making the various connections depends on the code generated by the digital modulator 1 and corresponds to the generation, at the output of the amplifier 25, of one of the four analog output levels.

The association of the capacitors C1 with the switches 28-1 to 28-6 and 29-1 to 29-6 enables the production of the various connection configurations necessary for the generation of the analog output levels The switching of the various switches carried out according to the state of the signals QXO and QX1 enables the generation of the four analog levels as shown in the timing diagram of FIG. 7.

As the diagram in FIG. 6 comprises only capacitors, switches and an amplifier, it is easy to produce and to integrate in an electronic circuit using the switched capacitors technique As mentioned before, the signal generated by the circuit in FIG. 6 contains both the useful signal and the quantification noise.

FIG. 7 shows a diagram of the various control signals of the digital-analog converter in FIG. 6, supplied by the modulator 1 and more particularly by the logic assembly 17a from the signals QX1, QXO, generated by the computing unit 16 and PHI1, PHI2 supplied by the clock signals generator 17 of the circuit shown in FIG. 4A.

The last line of this diagram shows the analog output signal of the digital-analog converter of FIG. 6, containing the four analog levels supplied by the latter.

The switched capacitors technique being appropriate for the production of active filters, it is advantageous to include the circuit of FIG. 6 in a more complex switched capacitors structure enabling the simultaneous carrying out of the following functions:
analog-digital conversion
low-pass filtering to eliminate the high frequency noise
sample and hold for reconstituting the analog signal.

The circuit then enables the direct reconstitution of the low frequency signal from the train of bits generated by the digital modulator One method of producing a circuit providing the three functions mentioned above is shown in FIG. 8.

The filter shown in FIG. 8 is a switched capacitors filter in which is incorporated the digital-analog converter described with reference to FIG. 6, which in fact constitutes the first stage of this filter.

It furthermore comprises a second stage for filtering and for reconstitution of a quasi-continuous analog output signal by combining the four analog output levels supplied by the first stage The first stage is identical to the circuit shown in FIG. 6 except for the fact that it no longer includes the switches 32, 33 for the zero resetting of the integration capacitors 30, 31 associated with the amplifier 25.

The outputs of the amplifier 25 of the digital-analog converter are connected via a third set of switches 35-1 to 35-4 to corresponding first terminals of the capacitors 36, 37 whose opposite terminals are connected to the respective inputs of an amplifier 38 by means of a fourth set of switches 39-1 to 39-4.

Integration capacitors 40, 41 are associated with the amplifier 38.

The outputs of the amplifier 38 are looped back to the corresponding inputs of the amplifier 25 by means of feedback capacitors 42, 43.

Capacitors 44, 45 are connected respectively by means of switches in parallel with the integration capacitors 40, 41, one terminal of each of them being connected to a corresponding terminal of a capacitor 42, 43.

Switches 46-1 to 46-4 respectively provide the connection of the common point of the capacitors 42, 44 and 43, 45 to ground and the connection of the outputs of the amplifier 38 to the feedback capacitors 42, 43.

Between each of the feedback capacitors 42, 43 and the corresponding input of the amplifier 25 there are connected switches 47-1, 47-2 and 47-3, 47-4 for pre-charging the capacitors 42, 43 by closing switches 47-2, 47-4 while opening switches 47-1, 47-3.

The switches 35-1 to 35-4, 39-1 to 39-4, 46-1 to 46-4 and 47-1 to 47-4 are controlled by the signals PHI1 and PHI2 from the clock signals generator.

The block diagram in FIG. 8 includes again the circuit constituted by the capacitors C1 and the associated switches which ensure the digital-analog conversion function. The charges of the capacitors C1 are in this case injected into the circuit constituted by the two amplifiers 25 and 38 and the capacitors 30, 31, 42, 43, 36, 37, 40, 41, 44, 45, having capacities C2 to C6, associated with their switches This circuit performs the low-pass filtering and sample and hold functions.

The conversion law in this case is defined by the equation:

$$V_s(nT) = KV_r(1 - 2QX1(nT))(1 + QX0(nT)) -$$

conversion function $$AV_s((n - 1)T) + BV_s((n - 2)T)$$

low-pass filtering function in which Vs is the analog output voltage, Vs(nT) represents the value of the voltage Vs at the instant nT, T is the sampling period, n is an integer without dimensions and A and B are constant coefficients of the filter.

Vs(nT) is constant during the duration of a period T (a function of the sample and hold circuit).

The sampling frequency of the system being very high (since it is an oversampling converter), the output signal is a quasi-continuous signal (as opposed to a sampled signal) which represents the useful part (low frequency) encoded by the modulator, the high frequency quantization noise being attenuated by the low-pass function. The image frequencies due to the sampling being high, a very simple smoothing filter suffices to attenuate them.

We claim:

1. A digital-analog converter for converting digital input signals to an analog output signal comprising:

an operational amplifier having first and second inputs and first and second outputs of respective opposite polarities;

a pair of first capacitors respectively corresponding to said first and second inputs of said operational amplifier;

first switching means disposed between said first capacitors and the first and second inputs of said operational amplifier and operable to selectively connect said first capacitors to said first and second inputs of said operational amplifier such that each of said first capacitors is interchangeably connectable to one of said first and second inputs and other of said first and second inputs of said operational amplifier;

first and second reference voltage sources of equal magnitude and opposite polarities;

second switching means for selectively connecting said first capacitors to the respective reference voltage sources or to ground;

feedback lines respectively connecting the first and second outputs of said operational amplifier to the corresponding first and second inputs thereof;

a pair of second capacitors respectively interposed in the feedback lines connecting the outputs of said operational amplifier to the inputs thereof;

said first and second switching means being controlled by digital signals to be converted for connecting the first capacitors to said reference voltage sources via and second switching means to pre-charge said first capacitors from said reference voltage sources during a first section of a conversion phase and for connecting the first capacitors to the feedback lines between the second capacitors and the inputs of said operational amplifier for producing at the outputs of the operational amplifier a plurality of analog voltage levels corresponding to the digital signals to be converted during a second section of the conversion phase serving as a redistribution phase; and the conversion of the digital input signals to the analog output signal being in accordance with the expression:

$$V_s(nT) = (C2/C1) \, V_r(1 - 2QX1(nT)) \, (1 + QX0(nT))$$

where $V_s$ is the analog output voltage,

T is the sampling period, n is an integer, $V_s(nT)$ represents the value of the voltage $V_s$ at the instant nT, QX1 is a first bit of the digital signal to be converted, QX0 is a second bit of the digital signal to be converted, C1 is the capacitance of each of the first capacitors, C2 is the capacitance of each o the second capacitors, and Vr is the voltage level corresponding to the reference voltage.

2. A digital-analog converter and switched capacitors filter assembly comprising:

a first stage defining a digital-analog converter and a second stage defining a switched capacitors filter, said first stage comprising:

a first operational amplifier having first and second inputs and first and second outputs of respective opposite polarities;

a pair of first capacitors respectively corresponding to said first and second inputs of said first operational amplifier;

a first group of switches for selectively connecting said first capacitors to said first and second inputs of said first operational amplifier;

first and second reference voltage sources of equal magnitude and opposite polarities;

a second group of switches for selectively connecting said first capacitors alternatively to said reference voltage sources or to ground;

feedback lines respectively connecting the first and second outputs of said first operational amplifier to the corresponding first and second inputs thereof;

a pair of second capacitors respectively interposed in the feedback lines connecting the outputs of said first operational amplifier to the inputs thereof; and said first and second groups of switches being controlled by digital signals to be converted for connecting the first capacitors to said reference voltage sources via said second group of switches to pre-charge said first capacitors from said reference voltage sources during a first section of a conversion phase and for connecting the first capacitors to the feedback lines between the second capacitors and the inputs of said first operational amplifier for producing at the outputs of the first operational amplifier a plurality of analog voltage levels corresponding to the digital signals to be converted during a second section of the conversion phase serving as a redistribution phase;

said second stage comprising:
- a second operational amplifier having first and second inputs and first and second outputs of respective opposite polarities;
- feedback lines respectively connecting the outputs of said second operational amplifier to the inputs thereof;
- integration capacitors respectively interposed in the feedback lines connecting the outputs of said second operational amplifier to the inputs thereof;
- means respectively connecting the outputs of said first operational amplifier to the inputs of said second operational amplifier;
- third capacitors respectively interposed between said first and second operational amplifiers and being disposed in said connecting means between the outputs of said first operational amplifier and the inputs of said second operational amplifier;
- feedback lines respectively connecting the outputs of said second operational amplifier to the inputs of said first operational amplifier;
- feedback capacitors respectively disposed in the feedback lines connecting the outputs of said second operational amplifier to the inputs of said first operational amplifier;
- third and fourth groups of switches respectively disposed in said means connecting the outputs of said first operational amplifier to the inputs of said second operational amplifier on opposite sides of said third capacitors;
- fifth and sixth groups of switches respectively disposed in said feedback lines connecting the outputs of said second operational amplifier to the inputs of said first operational amplifier on opposite sides of said feedback capacitors; and
- said third, fourth, fifth and sixth groups of switches being controlled by clock signals in combination with the digital signals to be converted for generating control signals for the digital-analog converter, the conversion of the digital input signals and the filtering of the resulting analog output signal being in accordance with the expression:

$$V_s(nT) = KV_r(1 - 2QX1(nT))(1 + QX0(nT)) -$$
(conversion function)
$$AV_s((n-1)T) + BV_s((n-2)T)$$
(low pass — filtering function)

where
- $V_s$ is the analog output voltage,
- T is the sampling period,
- n is an integer,
- $V_s(nT)$ represents the value of the voltage $V_s$ at the instant nT,
- QX1 is a first bit of the digital signal to be converted,
- QX0 is a second bit of the digital signal to be converted,
- Vr is the voltage level corresponding to the reference voltage, and
- K, A and B are constants.

3. A digital-analog conversion system comprising:

digital modulator means for receiving digital input signals and producing at its output a plurality of quantification levels representative of the digital input signals but having a reduced number of bits;

a digital-analog converter and switched capacitors filter assembly connected to the output of said digital modulator means, said digital-analog converter and switched capacitors filter assembly comprising:

a first stage defining a digital-analog converter and a second stage defining a switched capacitors filter, said first stage comprising:
- a first operational amplifier having first and second inputs and first and second outputs of respective opposite polarities;
- a pair of first capacitors respectively corresponding to said first and second inputs of said first operational amplifier;
- a first group of switches for selectively connecting said first capacitors to said first and second inputs of said first operational amplifier;
- first and second reference voltage sources of equal magnitude and opposite polarities;
- a second group of switches for selectively connecting said first capacitors alternatively to said reference voltage sources or to ground;
- feedback lines respectively connecting the first and second outputs of said first operational amplifier to the corresponding first and second inputs thereof;
- a pair of second capacitors respectively interposed in the feedback lines connecting the outputs of said first operational amplifier to the inputs thereof; and
- said first and second groups of switches being controlled by digital signals to be converted for connecting the first capacitors to said reference voltage sources via said second group of switches to pre-charge said first capacitors from said reference voltage sources during a first section of a conversion phase and for connecting the first capacitors to the feedback lines between the second capacitors and the inputs of said first operational amplifier for producing a t the outputs of the first operational amplifier a plurality of analog voltage levels corresponding to the digital signals to be converted during a second section of the conversion phase serving as a redistribution phase;

said second stage comprising:
- a second operational amplifier having first and second inputs and first and second outputs of respective opposite polarities;
- feedback lines respectively connecting the outputs of said second operational amplifier to the inputs thereof;
- integration capacitors respectively interposed in the feedback lines connecting the outputs of said second operational amplifier to the inputs thereof;
- means respectively connecting the outputs of said first operational amplifier to the inputs of said second operational amplifier;
- third capacitors respectively interposed between said first and second operational amplifiers and being disposed in said connecting means between the outputs of said first operational amplifier and the inputs of said second operational amplifier;
- feedback lines respectively connecting the outputs of said second operational amplifier to the inputs of said first operational amplifier;
- feedback capacitors respectively disposed in the feedback lines connecting the outputs of said second operational amplifier to the inputs of said first operational amplifier;
- third and fourth groups of switches respectively disposed in said means connecting the outputs of said first operational amplifier to the inputs of said second operational amplifier on opposite sides of said third capacitors;
- fifth and sixth groups of switches respectively disposed in said feedback lines connecting the outputs of said second operational amplifier to the inputs of said first operational amplifier on opposite sides of said feedback capacitors; and
- said third, fourth, fifth and sixth groups of switches being controlled by clock signals in combination with the digital signals to be converted for generating control signals for the digital-analog converter, the conversion of the digital input signals and the filtering of the resulting analog output signal being in accordance with the expression:

$$V_s(nT) = KVr(1 - 2QX1(nT))(1 + QX0(nT)) -$$
(conversion function)
$$AV_s((n-1)T) + BV_s((n-2)T)$$
(low pass — filtering function)

where
- $V_s$ is the analog output voltage,
- T is the sampling period,
- n is an integer,
- $V_s(nT)$ represents the value of the voltage $V_s$ at the instant nT,
- QX1 is a first bit of the digital signal to be converted,
- QX0 is a second bit of the digital signal to be converted,
- Vr is the voltage level corresponding to the reference voltage, and
- K, A and B are constants.

4. A digital-analog conversion system as set forth in claim 3, wherein said digital modulator means comprises a second order Delta-Sigma digital modulator.

5. a digital-analog conversion system as set forth in claim 3, wherein said digital modulator means comprises an input register for receiving the digital input signals to be converted quantifier means for receiving the output from said input register;
- first and second adders interposed between said input register and said quantifier means and being respectively connected in series between the output of said input register and the input of said quantifier means;
- a first feedback line connecting the output of said quantifier means to said second adder;
- a third adder disposed in said first feedback line between the output of said quantifier means and said second adder;
- a first register controlled at the output sampling frequency and disposed in said first feedback line between the output and the input of said quantifier means, said first register being located between said third and second adders;
- a second feedback line connecting the output of said quantifier means to said first adder;
- a fourth adder disposed in said second feedback line between the output of said quantifier means and said first adder;
- a second register controlled at the output sampling frequency and disposed in said second feedback line between the output and the input of said quantifier means, said second register being located between said fourth and first adders; and
- the third and fourth adders being respectively connected to the outputs of said second and first adders for receiving the output signals from said first and second adders.

6. A digital-analog conversion system as set forth in claim 5, wherein said first and second feedback lines connecting the output of said quantifier means to said second and said first adders respectively include a feedback line portion common thereto and disposed between the output of said quantifier means and the third and fourth adders; and respectively included in said first and second feedback lines; and
- an inverter circuit disposed in said feedback line portion common to said first and second feedback lines so as to be located between the output of said quantifier means and the corresponding inputs of said third and fourth adders.

7. A digital-analog conversion system as set forth in claim 3, further including a processing unit in which said digital modulator means is embodied, said processing unit comprising a cycle counter;
- a state decoder connected to the output of said cycle counter;
- a computing unit connected to the output of said state decoder and controlled thereby;
- a clock generator; and
- a logic assembly connected to the output of said clock generator and said computing unit for combining the output signals defining the digital input signals to be converted as provided by said computing unit and the output signals of the clock generator for supplying control signals in operating the groups of switches of the digital-analog converter and switched capacitors filter assembly.

8. A digital-analog conversion system as set forth in claim 7, wherein said computing unit of said processing unit comprises an input register;
- a composite adder forming a plurality of adders;
- first and second registers controlled by signals provided from said state decoder, said first and second registers having their outputs respectively connected to said composite adder;

quantifier means connected to the output of said composite adder;

a feedback bus connecting the output of said composite adder to the inputs of said first and second registers;

an output register connected to the output of said quantifier means and providing the digital signals for conversion into analog signals; and a code converter for receiving the output signals of the output register and having outputs connected to the inputs of said composite adder as respectively connected to the outputs of said first and second registers.

* * * * *